United States Patent

Kawai et al.

[11] Patent Number: 6,049,100
[45] Date of Patent: Apr. 11, 2000

[54] SOLID STATE IMAGE SENSOR UNIT WITH WIDE DYNAMIC RANGE AND HIGH RESOLUTION

[75] Inventors: Shinichi Kawai; Yasutaka Nakashiba, both of Tokyo, Japan

[73] Assignee: NEC Corporation, Tokyo, Japan

[21] Appl. No.: 08/994,896

[22] Filed: Dec. 19, 1997

[30] Foreign Application Priority Data

Dec. 20, 1996 [JP] Japan ................................. 8-340788

[51] Int. Cl.[7] ...................... H01L 27/148; H01L 29/768; H01L 31/0232
[52] U.S. Cl. ......................... 257/233; 257/229; 257/435
[58] Field of Search .................................. 257/231–233, 257/229, 435

[56] References Cited

U.S. PATENT DOCUMENTS 5,463,232  10/1995  Yamashita et al. ..................... 257/435
5,619,049  4/1997  Kim ........................................ 257/435
5,736,756  4/1998  Wakayama et al. .................... 257/435

FOREIGN PATENT DOCUMENTS 58-195371  11/1983  Japan .
10-107255  4/1998  Japan .

*Primary Examiner*—Gene M. Munson

[57] ABSTRACT

In a solid state image sensor unit which includes a substrate having a substrate surface and a plurality of first semiconductor regions formed on the substrate surface along a predetermined direction of the substrate surface with said first semiconductor regions substantially isolated electrically from each other. The solid state image sensor unit comprises a connection member formed on the substrate surface for supplying a reference potential to the first semiconductor regions in common.

10 Claims, 4 Drawing Sheets

$A_1 - A_2$ $B_1 - B_2$

SOLID STATE IMAGE SENSOR UNIT WITH WIDE DYNAMIC RANGE AND HIGH RESOLUTION

BACKGROUND OF THE INVENTION:

This invention relates to a solid state image sensor unit such as a charge coupled device and, more specifically, to a solid state image sensor unit having horizontal charge transfer portions connected to both ends of a vertical charge transfer portion.

Such a kind of solid state image sensor unit can arbitrarily select a desired one of a plurality of scanning directions of image capture according to a charge transfer pulse serving as a signal for charge transfer. Such a solid state image sensor unit is disclosed in Japanese Unexamined Patent Publication (JP-A) No. 195371/1983.

The conventional solid state image sensor unit comprises a central unit section for mainly performing photoelectric conversion and charge transfer in a unit center area and a peripheral unit section for mainly performing charge detection in a unit peripheral area. The central unit section includes a first semiconductor region and has a vertical charge transfer portion and first and second horizontal charge transfer portions formed at both ends of the vertical charge transfer portion. The peripheral unit section includes a second semiconductor region. The second semiconductor region is connected to a reference potential such as a ground potential. Generally, the first semiconductor region and the second semiconductor region are often called as "channel stopper", respectively.

However, it is found that the conventional solid state image sensor unit has the following problems.

In the conventional solid state image sensor unit, a semiconductor region serving as the main portion of the central unit section is not in physical contact with a second semiconductor region serving as the main portion of the peripheral unit section. However, the first semiconductor region and the second semiconductor region are electrically connected to each other through a well layer.

Here, the electrical resistance of the well layer is considerably higher than the electrical resistances of the first and the second semiconductor regions.

Therefore, the first semiconductor region is connected to the reference potential through the well layer having the high electrical resistance. For this reason, while the solid state image sensor unit is being used, a voltage of the first semiconductor region is easily affected by a charge transfer pulse and then easily varies. In addition, when the voltage of the first semiconductor region varies, charge transfer performance as the maximum amount of charge which can be transferred by the charge transfer portion and/or charge transfer efficiency are reduced because an effective amplitude of the charge transfer pulse becomes small. Therefore, the conventional solid state image sensor unit is narrow in dynamic range and low in resolution.

SUMMARY OF THE INVENTION

It is therefore an object of this invention to provide a solid state image sensor unit in which the plurality of scanning directions of image capture can be arbitrarily selected as a matter of course, the voltage of the first semiconductor region in the central unit section for performing photoelectric conversion and charge transfer is stable, and dynamic range is wide and resolution is high.

A solid state image sensor unit to which this invention is applicable includes a substrate having a substrate surface and a plurality of first semiconductor regions formed on the substrate surface along a predetermined direction of the substrate surface with the first semiconductor regions substantially isolated electrically from each other. The solid state image sensor unit comprises a connection member formed on the substrate surface for supplying a reference potential to the first semiconductor regions in common.

DESCRIPTION OF THE PREFERRED EMBODIMENTS

Figure 1:
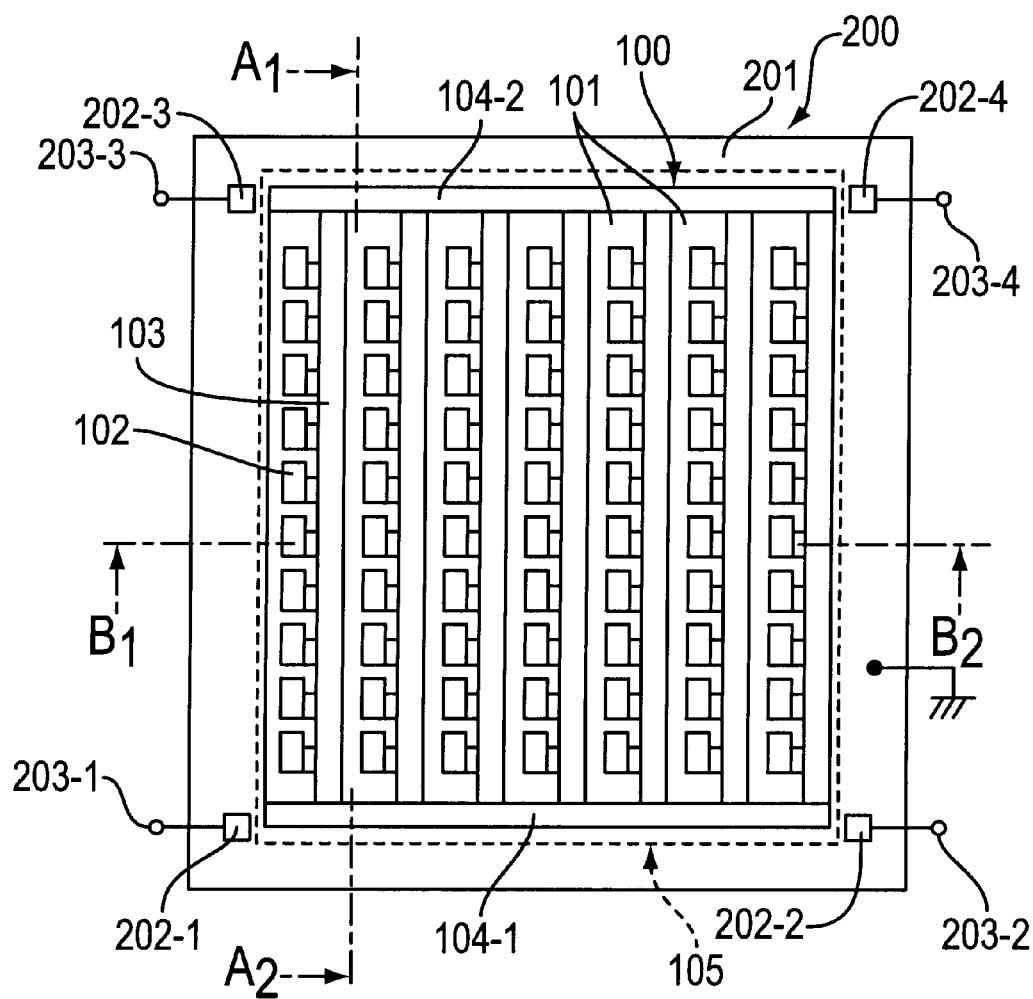
FIG. 1 is a top view conceptually showing a conventional solid state image sensor unit.

A conventional solid state image sensor unit will be described below with reference to FIGS. 1 to 3 in order to facilitate an understanding of the present invention. In FIG. 1, an insulating film and an entire-surface insulating film are omitted.

A conventional solid state image sensor unit is similar to that described in Japanese Unexamined Patent Publication (A) No. 195371/1983.

Referring to FIG. 1, the conventional solid state image sensor unit is of a so-called inter-line transfer type, and comprises a central unit section 100 for performing photoelectric conversion and charge transfer and a peripheral unit section 200 for mainly performing charge detection.

The central unit section 100 includes a plurailty of first $p^+$-type semiconductor regions 101 and has a plurality of vertical charge transfer portions 103, a plurality of photoelectric elements 102 arranged in correspondence with the vertical charge transfer portions 103, first and the second horizontal charge transfer portions 104-1 and 104-2 formed at both ends of the vertical charge transfer portions 103, and a light-shielding film 105. In FIG. 1, the numbers of the first $p^+$-type semiconductor regions 101, the vertical charge transfer portions 103, and the photoelectric elements 102 are not the actual numbers, but the conceptual numbers.

The light-shielding film 105 must be formed through an insulating film (not shown) on the entire surface of the central unit section 100 except the photoelectric elements 102. In other words, the light-shielding film 105 may be formed on the peripheral unit section 200 as well.

The peripheral unit section 200 includes a second $p^+$-type semiconductor region 201. The second $p^+$-type semiconductor region 201 is supplied with a ground potential as a reference potential. The peripheral unit section 200 has first, second, third, and fourth charge detection sections 202-1, 202-2, 202-3, and 202-4 which are electrically connected to both ends of the first and the second horizontal charge transfer portions 104-1 and 104-2 and output terminals 203-1, 203-2, 203-3, and 203-4 for outputting output signals of the charge detection sections.

Figure 2:
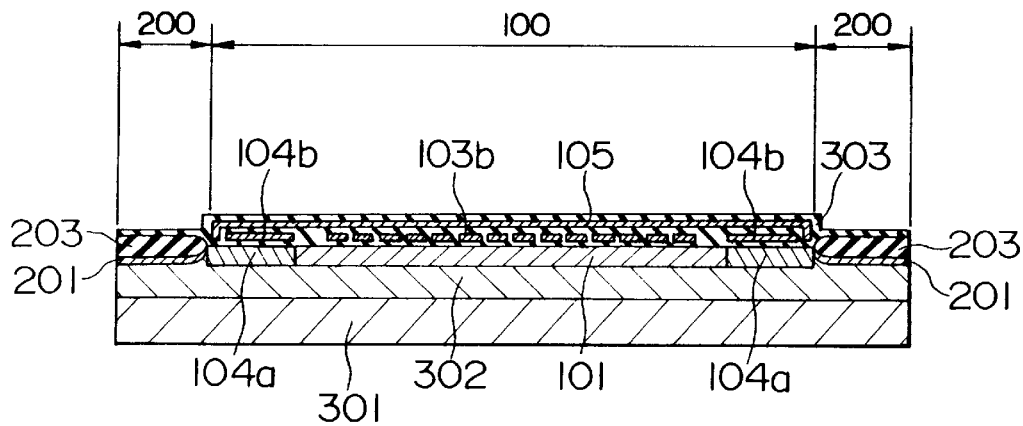
FIG. 2 is a sectional view taken along a line A1–A2 in FIG. 1.
Figure 3:
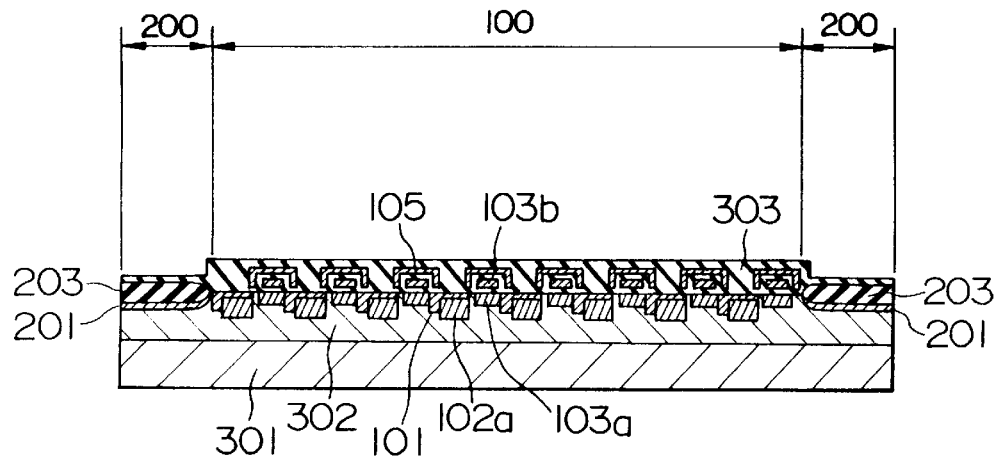
FIG. 3 is a sectional view taken along a line B1–B2 in FIG. 1.

Referring to FIGS. 2 and 3, the conventional solid state image sensor unit has an n$^-$-type semiconductor substrate 301 having an impurity concentration of about $5 \times 10^{14}$/cm$^3$ a p-type well layer 302 formed on the n$^-$-type semiconductor substrate 301 and having an impurity concentration of about $5 \times 10^{15}$/cm$^3$, and an entire-surface insulating film 303 formed on the entire surface of the uppermost layer of the unit. Each of the n$^-$-type semiconductor substrate 301, the p-type well layer 302, and the entire-surface insulating film 303 is essentially included in both of the central and the peripheral unit sections 100 and 200.

Furthermore, the solid state image sensor unit has the first p$^+$-type semiconductor region 101 serving as the main portion of the central unit section 100 and having an impurity concentration of about $1 \times 10^{18}$/cm$^3$, an n-type semiconductor region 103a (a part of the vertical charge transfer portions 103) having an impurity concentration of about $1 \times 10^{17}$/cm$^3$, an n-type semiconductor region 102a (a part of photoelectric conversion element 102) having an impurity concentration of about $5 \times 10^{16}$/cm$^3$, a pair of n-type semiconductor regions 104a (a part of the first and the second horizontal charge transfer portions 104-1 and 104-2) having an impurity concentration of about $1 \times 10^{17}$/cm$^3$, a charge transfer electrode 103b (a part of the vertical charge transfer portions 103) and a pair of charge transfer electrodes 104b (a part of the first and the second horizontal charge transfer portions 104-1 and 104-2) which consists of, e.g., poly-silicon, and the shielding film 105 constituted by, e.g., an aluminum film. The above-mentioned arrangement is included in the central unit section 100. The charge transfer electrodes 103b, the charge transfer electrodes 104b, and the shielding film 105 are formed in the entire-surface insulating film 303.

In FIGS. 2 and 3, the numbers of the first p$^{30}$-type semiconductor regions 101, the n-type semiconductor regions 102a, the n-type semiconductor regions 103a, the charge transfer electrodes 103b are not the actual number, but the conceptual number.

Furthermore, this solid state image sensor unit has the second p$^+$-type semiconductor region 201 formed on the p-type well layer 302 and having an impurity concentration of about $1 \times 10^{18}$/cm$^3$ and an insulating film 203 formed on the second p$^+$-type semiconductor region 201. The above-mentioned arrangement is included in the peripheral unit section 200. The second p$^+$-type semiconductor region 201 serves as the main portion of the peripheral unit section 200.

In the conventional solid state image sensor unit described above, the vertical charge transfer portion 103 and the first and the second horizontal charge transfer portions 104-1 and 104-2 can transfer charges in both longitudinal directions, respectively. Therefore, the scanning direction of an image capture can be arbitrarily selected according to a charge transfer pulse applied to the vertical charge transfer portion and the first and the second horizontal charge transfer portions.

However, it is found that the conventional solid state image sensor unit shown in FIGS. 1 to 3 has the following problems.

In the conventional solid state image sensor unit shown in FIGS. 1 to 3, the first p$^+$-type semiconductor region 101 serving as the main portion of the central unit section 100 is not in physical contact with the second p$^+$-type semiconductor region 201 serving as the main portion of the peripheral unit section 200. However, the first and the second p$^+$-type semiconductor regions 101 and 201 are electrically connected to each other through the p-type well layer 302.

Here, the electric resistance of the p-type well layer 302 is considerably higher than the electrical resistances of the first and the second p$^+$-type semiconductor regions 101 and 201. More specifically, the electrical resistance (sheet resistance) of the p-type well layer 302 is about 50 to 100 KΩ/□. On the other hand, the electrical resistances of the first and the second p$^+$-type semiconductor regions 101 and 201 are about 0.5 KΩ/□.

Therefore, the first p$^+$-type semiconductor region 101 is connected to the reference potential through the p-type well layer 302 having the high electrical resistance. For this reason, while the solid state image sensor unit is being used, a voltage of the first p$^+$-type semiconductor region 101 is easily affected by a charge transfer pulse and then easily varies. In addition, when the voltage of the first p$^+$-type semiconductor region 101 varies, charge transfer performance as the maximum amount of charge which can be transferred by the charge transfer portion and/or charge transfer efficiency are reduced because an effective amplitude of the charge transfer pulse becomes small. Therefore, the conventional solid state image sensor unit is narrow in dynamic range and low in resolution.

A solid state image sensor units according to embodiments of the present invention will be described below with reference to the accompanying drawing.

First Embodiment

Figure 4:
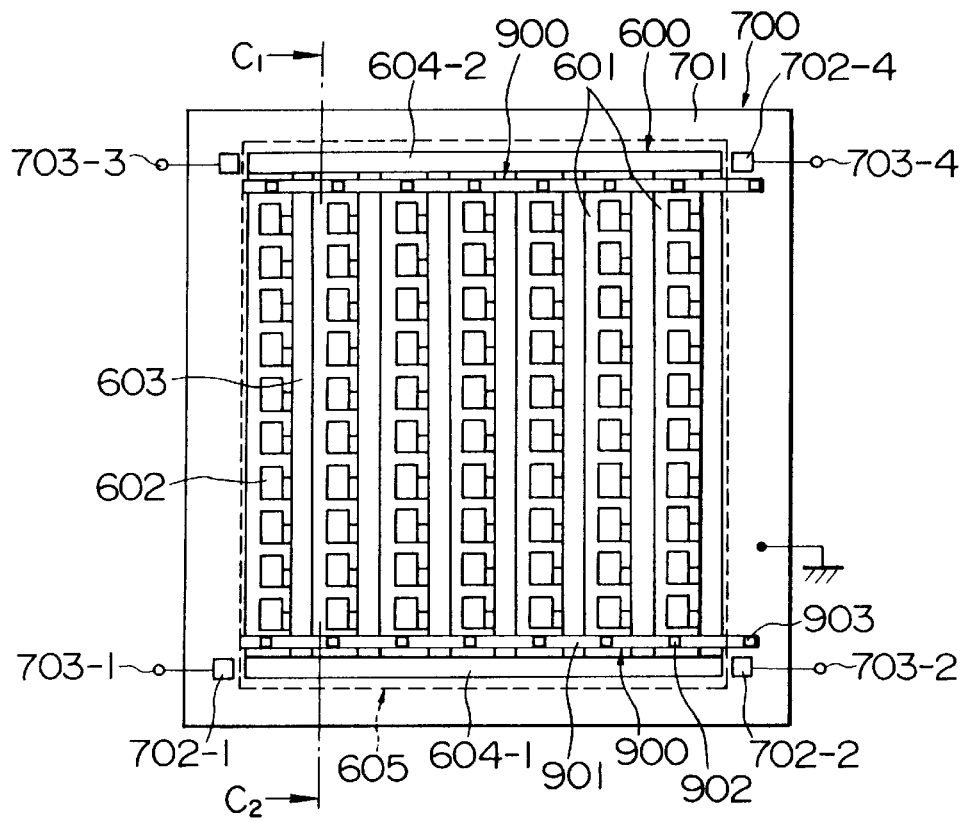
FIG. 4 is a top view conceptually showing a solid state image sensor unit according to a first embodiment of the present invention.

Referring to FIG. 4, a solid state image sensor unit according to a first embodiment of the present invention is of a so-called inter-line transfer type, and comprises a central unit section 600 for performing photoelectric conversion and charge transfer and a peripheral unit section 700 for mainly performing charge detection.

The central unit section 600 includes a plurality of first p$^+$-type semiconductor regions 601 and has a plurality of vertical charge transfer portions 603, a plurality of photoelectric elements 602 arranged in correspondence with the vertical charge transfer portions 603, first and the second horizontal charge transfer portions 604-1 and 604-2 formed at both ends of the vertical charge transfer portions 603, and a light-shielding film 605. In FIG. 4, the numbers of the first p$^+$-type semiconductor regions 601, the vertical charge transfer portions 603, and the photoelectric elements 602 are not the actual numbers, but the conceptual numbers.

The light-shielding film 605 must be formed through an insulating film (not shown) on the entire surface of the central unit section 600 except the photoelectric elements 602. In other words, the light-shielding film 605 may be formed on the peripheral unit section 700 as well.

The peripheral unit section 700 includes a second p$^+$-type semiconductor region 701. The second p$^+$-type semiconductor region 701 is supplied with a ground potential as a reference potential. The peripheral unit section 700 has first, second, third, and fourth charge detection sections 702-1, 702-2, 702-3, and 702-4 which are electrically connected to both ends of the first and second horizontal charge transfer portions 604-1 and 604-2 and output terminals 703-1, 703-2, 703-3, and 703-4 for outputting output signals of the charge detection sections.

Figure 5:
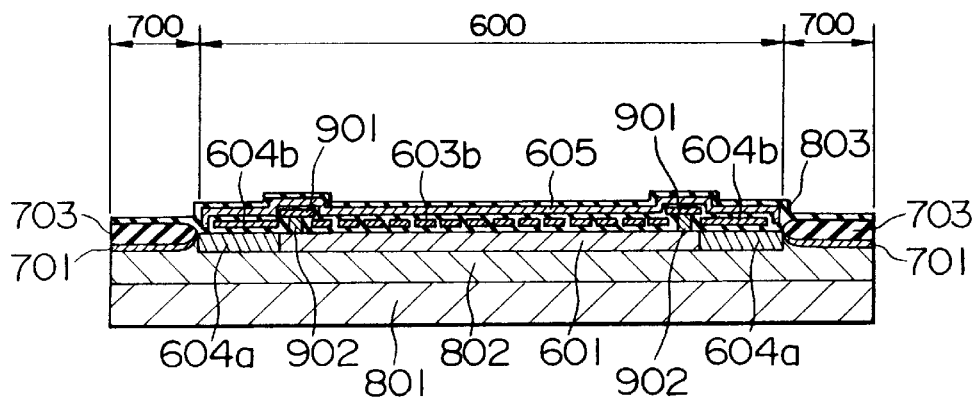
FIG. 5 is a sectional view taken along a line C1–C2 in FIG. 4.

Referring to FIG. 5, the solid state image sensor unit has an n$^-$-type semiconductor substrate 801 having an impurity concentration of about $5 \times 10^{14}$/cm$^3$, a p-type well layer 802 formed on the n$^-$-type semiconductor substrate 801 and having an impurity concentration of about $5 \times 10^{15}$/cm$^3$, and an entire-surface insulating film 803 formed on the entire surface of the uppermost layer of the unit. Each of the n⁻-type semiconductor substrate 801, the p-type well layer 802, and the entire-surface insulating film 803 is essentially included in both of the central and the peripheral unit sections 600 and 700.

Furthermore, the solid state image sensor unit has the first p⁺-type semiconductor region 601 serving as the main portion of the central unit section 600 and having an impurity concentration of about $1 \times 10^{18}/cm^3$, an n-type semiconductor region (not shown and a part of the vertical charge transfer portions 603) having an impurity concentration of about $1 \times 10^{17}/cm^3$, an n-type semiconductor region (not shown and a part of photoelectric conversion element 602) having an impurity concentration of about $5 \times 10^{16}/cm^3$, a pair of n-type semiconductor regions 604*a* (a part of the first and the second horizontal charge transfer portions 604-1 and 604-2) having an impurity concentration of about $1 \times 10^{17}/cm^3$, a charge transfer electrode 603*b* (a part of the vertical charge transfer portions 603) and a pair of charge transfer electrodes 604*b* (a part of the first and the second horizontal charge transfer portions 604-1 and 604-2) which consists of, e.g., poly-silicon, and the shielding film 605 constituted by, e.g., an aluminum film. The above-mentioned arrangement is included in the central unit section 600. The charge transfer electrodes 603*b*, the charge transfer electrodes 604*b*, and the shielding film 605 are formed in the entire-surface insulating film 803.

In FIG. 5, the numbers of the first p⁺-type semiconductor regions 601, the charge transfer electrodes 603*b* are not the actual number, but the conceptual number.

Furthermore, this solid state image sensor unit has the second p⁺-type semiconductor region 701 formed on the p-type well layer 802 and having an impurity concentration of about $1 \times 10^{18}/cm^3$ and an insulating film 703 formed on the second p⁺-type semiconductor region 701. The above-mentioned arrangement is included in the peripheral unit section 700. The second p⁺-type semiconductor region 701 serves as the main portion of the peripheral unit section 700.

Here, the electric resistance of the p-type well layer 802 is considerably higher than the electrical resistances of the first and the second p⁺-type semiconductor regions 601 and 701. More specifically, the electrical resistance (sheet resistance) of the p-type well layer 802 is about 50 to 100 KΩ/□. On the other hand, the electrical resistances of the first and the second p⁺-type semiconductor regions 601 and 701 are about 0.5 KΩ/□.

In the unit described above, the vertical charge transfer portion 603 and the first and the second horizontal charge transfer portions 604-1 and 604-2 can transfer charges in both the longitudinal directions. Therefore, the scanning direction of an image capture can be arbitrarily selected according to a charge transfer pulse applied to the vertical charge transfer portion and the first and the second horizontal charge transfer portions.

Now, the solid state image sensor unit according to the first embodiment comprises a connection member 900 for electrically connecting the first and the second p⁺-type semiconductor regions 601 and 701 to each other.

The connection member 900 has a pair of wiring portions 901 formed on the unit through an insulating film 803 so as to extend over the first and the second p⁺-type semiconductor regions 601 and 701, first contact portions 902 connecting between the pair of wiring portion 901 and the first p⁺-type semiconductor region 601, respectively, and a pair of second contact portions 903 connecting between the pair of wiring portions 901 and the second p⁺-type semiconductor region 701, respectively. The wiring portions 901 and the first and the second contact portions 902 and 903 have an electrical resistance not higher than a predetermined electrical resistance, respectively. The predetermined electrical resistance is preferably equal to 1 KΩ/□. In order to achieve the above-mentioned electrical resistance, the wiring portions 901 and the first and the second contact portions 902 and 903 may consist of aluminum, tungsten, and so on.

The pair of wiring portions 901 are formed on the central unit section 600 so as to be laid on a pair of adjacent regions where the vertical charge transfer portion 603 and the first and the second horizontal charge transfer portions 604-1 and 604-2 are adjacent to each other, respectively. The pair of first contact portions 902 are electrically connected to the first semiconductor region 601 at the pair of adjacent regions, respectively.

Here, if the first contact portions 902 are formed near the photoelectric conversion elements 602 in the central unit section 600, the central unit section 600 requires an area which is large to some extent. When the central unit section 600 secures an area which is large to some extent, in contrast to the area of the central unit section 600, the areas of the photoelectric conversion elements 602 or the vertical charge transfer portions 603 become small. When the areas of the photoelectric conversion elements 602 or the vertical charge transfer portions 603 are small, the sensitivity of the photoelectric conversion elements 602 or the charge transfer performance of the vertical charge transfer portion 603 may be degraded. Therefore, the wiring portions 901 and the contact portions 902 are preferably formed near the connection portions between the vertical charge transfer portion 603 and the first and the second horizontal charge transfer portions 604-1 and 604-2.

Referring to FIG. 5, wiring portions 901 connected to the second p⁺-type semiconductor region 701 (see FIG. 4) and the first contact portions 902 are formed in the insulating film 803. As is apparent from FIGS. 4 and 5, in the first embodiment of the present invention, since the first p⁺-type semiconductor region 601 and the second p⁺-type semiconductor region 701 having the reference potential are electrically connected to each other through the wiring member 900 having a low resistance, the potential of the first p⁺-type semiconductor region 601 is not affected by a charge transfer pulse applied to a charge transfer electrode 603*b* and is stable. When the potential of the first p⁺-type semiconductor region 601 is stable, charge transfer performance and/or charge transfer efficiency are not reduced because an effective amplitude of the charge transfer pulse does not become small. Therefore, the solid state image sensor unit according to this invention is wide in dynamic range and high in resolution.

Second Embodiment

Figure 6:
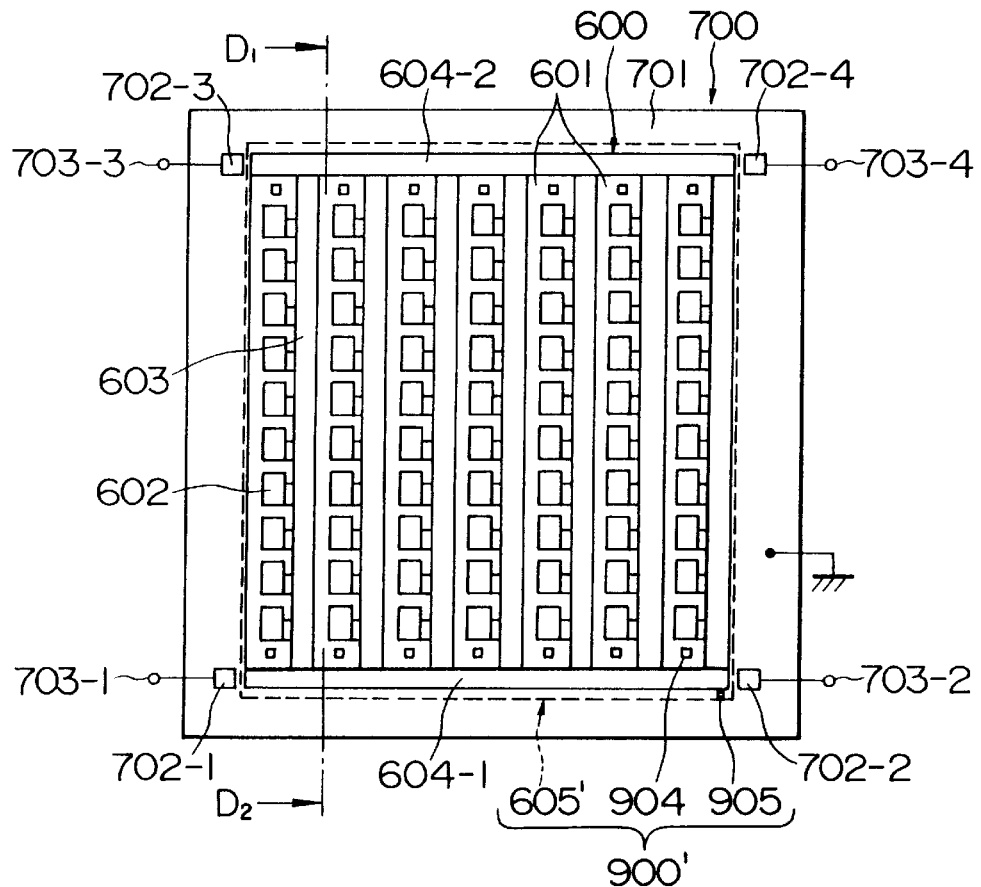
FIG. 6 is a top view conceptually showing a solid state image sensor unit according to a second embodiment of the present invention.
Figure 7:
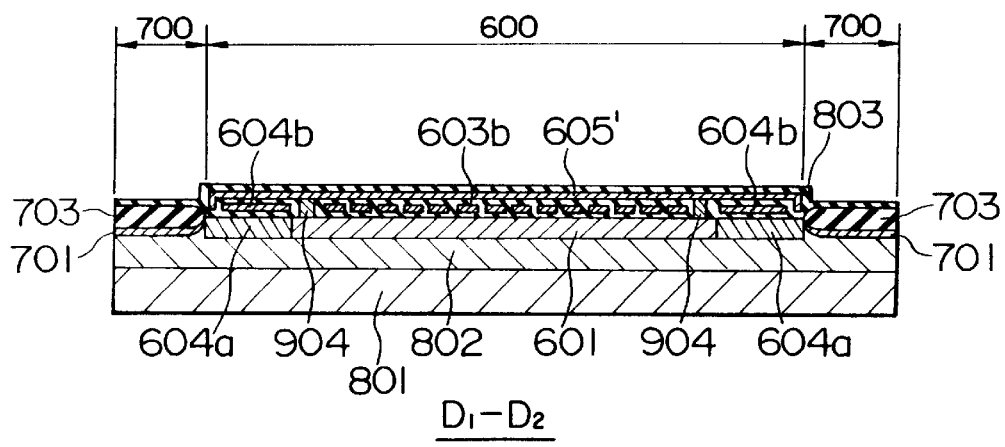
FIG. 7 is a sectional view taken along a line D1–D2 in FIG. 6.

Referring to FIGS. 6 and 7, a solid state image sensor unit according to a second embodiment of the present invention comprises similar parts designated by like reference numerals of FIGS. 4 and 5 showing the first invention.

Now, the solid state image sensor unit according to the second embodiment comprises a connection member 900' for electrically connecting the first and the second p⁺-type semiconductor regions 601 and 701 to each other and a light-shielding film 605' formed thereon so as to extend over the central and the peripheral unit sections 600 and 700.

The connection member 900' has a wiring portion formed on the unit through the insulating film 803 so as to extend over the first and the second p⁺-type semiconductor regions 601 and 701, first contact portions 904 connecting between the wiring portion and the first p⁺-type semiconductor region 601, and second contact portions 905 connecting between the wiring portion and the second p⁺-type semiconductor region 701.

In this embodiment, the wiring portion consists of the light-shielding film 605'.

The light-shielding film 605' and the first and the second contact portions 904 and 905 have an electrical resistance not higher than a predetermined electrical resistance, respectively. The predetermined electrical resistance is preferably equal to 1 KΩ/□. In order for the above-mentioned electrical resistance, the light-shielding film 605' and the first and the second contact portions 904 and 905 may consist of aluminum, tungsten, and so on.

The first contact portions 904 are electrically connected to the first semiconductor region 601 so as to be located at a pair of adjacent regions where the vertical charge transfer portion 603 and the first and the second horizontal charge transfer portions 604-1 and 604-2 are adjacent to each other, respectively.

Here, if the first contact portions 904 are formed near photoelectric conversion elements 602 in the central unit section 600, the central unit section 600 requires an area which is large to some extent. When the central unit section 600 secures an area which is large to some extent, in contrast to the area of the central unit section 600, the areas of the photoelectric conversion elements 602 or the vertical charge transfer portions 603 become small. When the areas of the photoelectric conversion elements 602 or the vertical charge transfer portions 603 are small, the sensitivity of the photoelectric conversion elements 602 or the charge transfer performance of the vertical charge transfer portion 603 may be degraded. Therefore, the contact portions 904 are preferably formed near the connection portions between the vertical charge transfer portion 603 and the first and the second horizontal charge transfer portions 604-1 and 604-2.

Referring to FIG. 7, the light-shielding film 605' connected to the second p⁺-type semiconductor region 701 (see FIG. 6) and the first contact portions 904 are formed in the insulating film 803. As is apparent from FIGS. 6 and 7, in the second embodiment of the present invention, since the first p⁺-type semiconductor region 601 and the second p⁺-type semiconductor region 701 having the reference potential are electrically connected to each other through the wiring member 900' having a low resistance, the potential of the first p⁺-type semiconductor region 601 is not affected by a charge transfer pulse applied to a charge transfer electrode 603b and is stable. When the potential of the first p⁺-type semiconductor region 601 is stable, charge transfer performance and/or charge transfer efficiency are not reduced because an effective amplitude of the charge transfer pulse does not become small. Therefore, the solid state image sensor unit according to this invention is wide in dynamic range and high in resolution.

In addition, the light-shielding film 605' in the second embodiment has not only the function of shielding of light but also a function similar to the function of the wiring portion 901 in the first embodiment. Therefore, the unit is simple in the entire structure thereof and can be easily manufactured.

Although the solid state image sensor units according to the first and the second embodiments of the present invention comprises the charge transfer portions having a buried channel formed in a p-type well layer on an n-type semiconductor substrate, the present invention can also be similarly applied to such a kind of solid state image sensor unit comprising a charge transfer portion having a buried channel formed on a p-type semiconductor substrate.

What is claimed is:

1. A solid state image sensor unit which includes a substrate having a substrate surface and a plurality of first semiconductor regions formed on said substrate surface along a predetermined direction of said substrate surface with said first semiconductor regions substantially isolated electrically from each other, wherein comprising:

a connection member formed on said substrate surface for supplying a reference potential to said first semiconductor regions in common; and a central unit section, formed on a central area of said substrate surface, to perform photoelectric conversion and charge transfer and a peripheral unit section, formed on a peripheral area of said substrate surface, to mainly perform charge detection;

said first semiconductor regions being formed in said central unit section;

said central unit section comprising a plurality of vertical charge transfer portions formed between each of said first semiconductor regions and extended along a vertical direction vertical to said predetermined direction and a pair of horizontal charge transfer portions formed at both ends of each of said vertical charge transfer portions and extended along a horizontal direction parallel to said predetermined direction;

said peripheral unit section comprising a second semiconductor region formed along said peripheral area, said second semiconductor region being supplied with said reference potential;

said first semiconductor regions being substantially isolated electrically from said second semiconductor region by said horizontal charge transfer portions and one of said vertical charge transfer portions;

said connection member electrically connecting said first semiconductor regions and said second semiconductor region to each other.

2. A solid state image sensor unit as claimed in claim 1, wherein further comprising a plurality of photoelectric elements formed on said substrate surface along each of said first semiconductor regions;

each of said first semiconductor regions allowing a charge shift from said photoelectric elements to the vertical charge transfer portion adjacent on one side of the first semiconductor region but stopping the charge shift from the photoelectric elements to the vertical charge transfer portion adjacent on the opposite side of the first semiconductor region.

3. A solid state image sensor unit as claimed in claim 1, wherein said connection member has a wiring portion formed on said solid state image sensor unit through an insulating film and extended over said first semiconductor regions and said second semiconductor region, a first contact portion connecting said wiring portion and each of said first semiconductor regions to each other, and a second contact portion connecting said wiring portion and said second semiconductor region to each other.

4. A solid state image sensor unit as claimed in claim 3, wherein further comprising a light-shielding film formed on said substrate surface and extended over said central and said peripheral unit sections, said light-shielding film having an electrical conductivity and serving as said wiring portion of said connection member.

5. A solid state image sensor unit as claimed in claim 3, wherein said wiring portion is formed on said central unit section and be laid on an adjacent region where each of said vertical charge transfer portions and either one of horizontal charge transfer portions are adjacent to each other;

said first contact portions being electrically connected to said first semiconductor regions at said adjacent region.

6. A solid state image sensor unit as claimed in claim 1, wherein said connection member has a pair of wiring portions formed on said solid state image sensor unit through an insulating film and extended over said first and said second semiconductor regions, a pair of first contact portions connecting each of said pair of wiring portions and said first semiconductor regions to each other, and a pair of second contact portions connecting said pair of wiring portions and said second semiconductor region to each other.

7. A solid state image sensor unit as claimed in claim 6, wherein said pair of wiring portions is formed on said central unit section so as to be laid on a pair of adjacent regions where each of said vertical charge transfer portions and said horizontal charge transfer portions are adjacent to each other;

said pair of first contact portions being electrically connected to each of said first semiconductor regions at said pair of adjacent regions.

8. A solid state image sensor unit as claimed in claim 1, wherein further comprising a light-shielding film formed on said substrate surface and extended over said central and said peripheral unit sections, said light-shielding film having an electrical conductivity;

said connection member has a wiring portion formed on said solid state image sensor unit through an insulating film and extended over said first and said second semiconductor regions;

said light-shielding film serving as said wiring portion;

said connection member further has a pair of first contact portions connecting said light-shielding film and said first semiconductor regions to each other on a pair of adjacent regions where each of said vertical charge transfer portions and said horizontal charge transfer portions are adjacent to each other and a pair of second contact portions connecting said light-shielding film and said second semiconductor region to each other on said pair of adjacent regions.

9. A solid state image sensor unit as claimed in claim 8, wherein said first contact portions is electrically connected to said first semiconductor regions at an adjacent region where each of said vertical charge transfer portions and either one of horizontal charge transfer portions are adjacent to each other.

10. A solid state image sensor unit as claimed in claim 1, wherein said connection member is formed by use of a method of forming electrodes of said vertical and said horizontal charge transfer portions.

* * * * *